US006593238B1

(12) United States Patent
Haggart, Jr. et al.

(10) Patent No.: US 6,593,238 B1
(45) Date of Patent: Jul. 15, 2003

(54) METHOD FOR DETERMINING AN ENDPOINT AND SEMICONDUCTOR WAFER

(75) Inventors: David Weston Haggart, Jr., Scottsdale, AZ (US); Walter Glashauser, Unterhaching (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/723,151

(22) Filed: Nov. 27, 2000

(51) Int. Cl.$^7$ ............................................. H01L 21/302
(52) U.S. Cl. ........................ 438/691; 438/692; 438/693
(58) Field of Search ................. 438/690, 691, 438/692, 693; 451/11, 10, 5, 6, 21, 63

(56) References Cited

U.S. PATENT DOCUMENTS

| | | | |
|---|---|---|---|
| 4,147,435 A | | 4/1979 | Habegger |
| 4,660,980 A | | 4/1987 | Takabayashi et al. |
| 5,036,015 A | | 7/1991 | Sandhu et al. |
| 5,220,405 A | | 6/1993 | Barbee et al. |
| RE34,425 E | | 11/1993 | Schultz |
| 5,306,089 A | | 4/1994 | Hosoe |
| 5,413,941 A | | 5/1995 | Koos et al. |
| 5,433,651 A | | 7/1995 | Lustig et al. |
| 5,439,551 A | | 8/1995 | Meikle et al. |
| 5,461,007 A | | 10/1995 | Kobayashi |
| 5,552,346 A | | 9/1996 | Huang et al. |
| 5,647,952 A | | 7/1997 | Chen |
| 5,663,797 A | * | 9/1997 | Sandhu .................. 438/16 |
| 5,691,253 A | * | 11/1997 | Kobayashi ............ 438/690 |
| 5,804,490 A | | 9/1998 | Fiegl et al. |
| 6,057,602 A | * | 5/2000 | Hudson et al. ......... 257/752 |

(List continued on next page.)

FOREIGN PATENT DOCUMENTS

| | | |
|---|---|---|
| EP | 0743674 A2 | 11/1996 |
| JP | 64-035308 | 2/1989 |
| JP | 01-131409 | 5/1989 |
| JP | 04-072551 | 3/1992 |
| JP | 05-062952 | 3/1993 |
| JP | 05-216222 | 8/1993 |
| JP | 07-249599 | 9/1995 |
| JP | 07-251371 | 10/1995 |
| WO | WO98/21748 | 5/1998 |

OTHER PUBLICATIONS

"End–Point Detection of Oxide Polishing and Planarization of Semiconductor Devices," *Kenneth Mason Publications*, Hampshire, Great Britain, Aug. 1, 1992, p. 647, No. 340.
"Shallow Trench Planarization Process with Chemical–Mechanical Polish Endpoint," *IBM Technical Disclosure Bulletin*, IBM Corp., New York, US, Jul. 1, 1990, pp. 75–76, vol. 33, No. 2.
Wijekoon, K. et al., "Development of a Production Worthy Copper CMP Process," *Advamced Semiconductor Manufacturing Conference and Workshop*, 1998 IEEE/SEMI Boston, Massachusetts, USA, Sep. 23–25, 1998, pp. 354–363.

(List continued on next page.)

*Primary Examiner*—Benjamin L. Utech
*Assistant Examiner*—Lan Vinh
(74) *Attorney, Agent, or Firm*—Kim-Marie Vo

(57) ABSTRACT

A method for determining an endpoint during chemical-mechanical polishing of a semiconductor wafer (100, 200) is disclosed. The method comprises the steps of depositing on a first layer (106, 206) to be polished a second layer (108, 208), the physical properties of the first layer (106, 206) being different from the physical properties of the second layer (108, 208). After that, the wafer (100, 200) is polished by chemical-mechanical polishing. Due to the different physical properties of the layers, a variation of the physical properties can be detected, and an endpoint can be determined on the basis of the detected variation. Further, a semiconductor wafer for use in a chemical-mechanical polishing process is disclosed.

15 Claims, 1 Drawing Sheet

U.S. PATENT DOCUMENTS

| | | | | |
|---|---|---|---|---|
| 6,080,655 A | * | 7/2000 | Givens et al. | 438/626 |
| 6,186,864 B1 | * | 2/2001 | Fisher et al. | 451/6 |
| 6,207,533 B1 | * | 3/2001 | Gao | 438/424 |
| 6,218,299 B1 | | 4/2001 | Akahori et al. | |
| 6,344,413 B1 | * | 2/2002 | Zurcher et al. | 438/678 |

OTHER PUBLICATIONS

Bret W. Adams et al., "Process Control and Endpoint Detection with Fullscan ISRM System in Chemical Mechanical Polishing of Cu layers", CMP–MIC Mar. 2000, 5 pgs.

Weijen Tsai, "Production Worthy Cu CMP Process", Foresight Oct. 2001, pp. 39–43.

Mike Berman et al, "Review of In Situ & In–line Detection for CMP Applications", Semiconductor Fabtech—$8^{th}$ Edition, pp. 267–274.

Kenichiro Horio et al., "Comparison of some instruments for measuring mirrorlike surfaces", Nanotechnology 2 (1991), pp. 33–38.

Abe, et al., "Microroughness Measurements on Polished Silicon Wafers", Japanese Journal of Appl. Phys.; vol. 31, Pt. 1, No. 3, 1992, pp. 721–728.

Montgomery et al., "Three Dimensional Nanoprofiling of Semiconductor Surfaces," SPIE vol. 1332, 1990, pp. 515–524.

* cited by examiner

METHOD FOR DETERMINING AN ENDPOINT AND SEMICONDUCTOR WAFER

FIELD OF THE INVENTION

The present invention generally relates to a method for determining an endpoint during chemical-mechanical polishing of a semiconductor wafer, and more particularly to a method for determining an endpoint on the basis of a semiconductor wafer with an additional layer. The present invention further generally relates to a semiconductor wafer for use in a chemical-mechanical polishing process, and more particularly to a semiconductor wafer having an additional layer on basis of which an endpoint is determined.

BACKGROUND OF THE INVENTION

Chemical-mechanical polishing or planarization ("CMP") processes are for example used in the production of microelectronic devices for forming a flat surface on semiconductor wafers.

FIG. 1 schematically illustrates a conventional polishing device 10. The polishing device comprises a polishing platen with a polishing pad 14 thereon. A wafer 16 is carried by a wafer carrier 18. The polishing platen 12 is carried by a drive assembly 20.

During operation of the conventional polishing apparatus 10 according to FIG. 1, the wafer 16 is positioned on the polishing pad 14 on which a polishing slurry is provided. Due to a rotational and/or translational movement of the wafer carrier 18 and/or the drive assembly 20, the wafer 16 and the polishing pad 14 are moved relative to one another. Due to the moving of the face of the wafer 16 across the surface of the polishing pad 14, the polishing pad 14 and the slurry remove material from the wafer 16.

It is extremely important that by chemical-mechanical polishing thicknesses of the polished layers are achieved that are within a certain range. Further, the surface of the wafer has to be uniform and planar. The correct thicknesses are important, since they influence the functional behavior of the wafer in operation. A planar surface is for example desired, when lithographic techniques are used in order to form patterns on the wafer. Such patterns can only be formed properly when the light for the lithographic process can be tightly focussed within a certain range. However, a reliable focussing is only possible with a planar surface.

Several techniques in order to achieve a correct "endpointing" for a polishing process have been proposed. For example, it has been suggested to use the change of the optical appearance of the wafer surface when a particular layer has been removed. Also a change in frictional behavior has been suggested to be used as an indication of an endpoint. However, there are general problems related to all of these techniques. For example, the monitoring of the optical appearance is difficult, since only an average value of the appearance of the wafer surface may be obtained, for example by a scanning operation; such an average value is not satisfying in all cases, particular when the structures on the wafer surface become smaller and smaller. Further, it may happen, that the optical appearance does not change at all, although a layer has been removed. Similar problems are related to a frictional determination of an endpoint.

Another endpointing method is disclosed in U.S. Pat. No. 6,057,602. It has been suggested to deposit an additional layer on the desired endpoint thickness, and, thereafter, to position the material to be polished. The additional layer has an extremely low polishing rate, so that the polishing "automatically" stops when the additional layer is reached. However, it is a drawback of such method that a non-planar structure of the additional layer, for example due to a topography, is probably not sufficiently planarized. This leads to the problems discussed above when lithographic methods are applied to the wafer.

As mentioned above, conventional endpointing methods in CMP processes detect the transition from a material that has just been removed to a material which is uncovered by the polishing. Thus, the conventional methods are not applicable, when there is no material transition, for example in an interlayer dielectric (ILD) oxide polish. The present invention seeks to solve the above mentioned problems and to provide a method and a semiconductor wafer that allow reliable endpointing and accurate polishing results.

DETAILED DESCRIPTION OF PREFERRED EMBODIMENTS

According to the invention, a method for determining an endpoint during chemical-mechanical polishing of a semiconductor wafer 100, 200 comprises the steps of depositing—on a first layer to be polished (e.g., layer 106, 206)—a second layer (e.g., layer 108, 208), the physical properties of the first layer being different from the physical properties of the second layer, polishing the second layer of the wafer by chemical-mechanical polishing, detecting a variation of the physical properties during the chemical-mechanical polishing (i.e. when polishing reaches the first layer), and determining an endpoint on the basis of the detected variation.

According to the invention there is further provided a semiconductor wafer for use in a chemical-mechanical polishing process which comprises a substrate, a device feature formed on the substrate, a first layer to be polished over the substrate, and a second layer deposited on the first layer, the physical properties of the first layer being different from the physical properties of the second layer, and the variation of the physical properties during the chemical-mechanical polishing (at the transition between second and first layers) indicating an endpoint.

On the basis of the invention an accurate endpointing can be achieved also when there is no material transition that may conventionally be used for determining an endpoint. Since a "sacrificial" layer is deposited on the layer that has to be polished, the endpoint can be chosen to be at any position across the layer to be polished.

Figure 1:
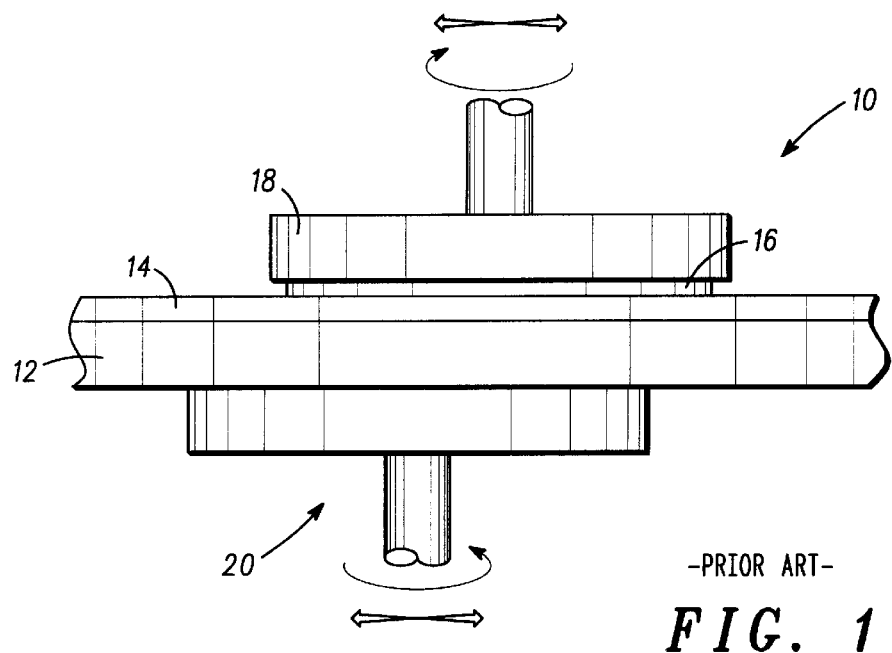
FIG. 1 is a partial schematic cross-sectional view of a polishing machine according to prior art.
Figure 2:
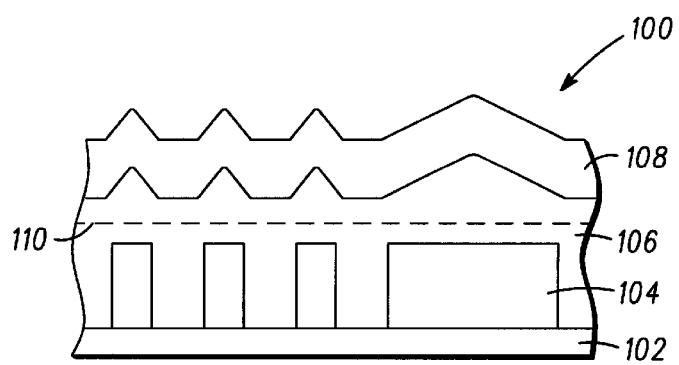
FIG. 2 is a partial schematic cross-sectional view of a wafer according to the present invention.

FIG. 2 is a partial schematic cross-sectional view of a semiconductor wafer 100 according to the present invention. The wafer 100 comprises of a substrate 102 and several layers that are arranged on the substrate 102. The layer above the substrate 102 is for example a metal layer 104 that represents a device feature. The pattern on the metal layer 104 has been formed by lithographic processing and plasma etch processing. An oxide layer 106 as an insulating layer is deposited over the substrate 102 and on the metal layer 104. The oxide layer 106 has a non-planar surface due to the non-uniform metal layer 104. On the oxide layer 106 a top layer 108 is provided that, for example, comprises of polysilicon. The dashed line 110 that lies within the oxide layer 106 represents the desired remaining thickness of the oxide layer after the polishing process.

After deposition of the oxide layer 106 which is preferably a high density plasma oxide (HDPO), the surface of the oxide has a topographic appearance, as illustrated in FIG. 2.

In order to planarize the oxide it is generally possible (and without using layer 108) to make the oxide layer 106 relatively thick and, after that, to remove the oxide layer 106 by a chemical-mechanical polishing process. Thus, due to the thickness of the oxide layer, the polishing process has enough time to remove the non-planar structure. However, with such method, it is not possible to find the correct endpoint for polishing, in particular, since a remaining oxide thickness is desired over the metal layer 104.

Therefore, the present invention suggests to deposit the oxide layer 106 that is relatively thin. On such relatively thin oxide layer 106, the top layer 108 is deposited. The top layer 108 has different physical properties than the oxide layer 106, so that during chemical-mechanical polishing of the top layer 108 the transition to the oxide layer 106 can be detected.

If the remaining thickness 110 is just below the surface of the oxide layer 106, the polishing process is stopped just after a variation of the physical properties is detected, e.g., optical behavior such as reflectiveness or refractivity, or frictional behavior.

In the case that the desired thickness 110 is below the surface of the oxide layer 106 by a relatively large amount, the chemical-mechanical polishing process is stopped when a certain time interval has expired after a variation of the physical properties was detected.

It is particularly advantageous that the length of such time interval is determined during the polishing of the layer 108, thereby taking variations of e.g., the polishing device into account.

In this case it is preferable that the top layer 108 has a similar polishing rate as the oxide layer 106. Firstly, because the time interval for endpointing can be accurately determined within the polishing process. Secondly, because different polishing rates might lead to a new topography when a simultaneous polishing of both materials in the border region takes place.

However, in special cases it can also be advisable to chose a material for the top layer 108 that has a different polishing rate than the oxide layer 106, e.g., if the polishing rate itself is taken as the physical property on basis of which the endpoint is determined.

In any case, after the polishing a wafer remains with a substrate 102, a device feature 104 and an oxide layer 106 with the remaining thickness 110.

Figure 3:
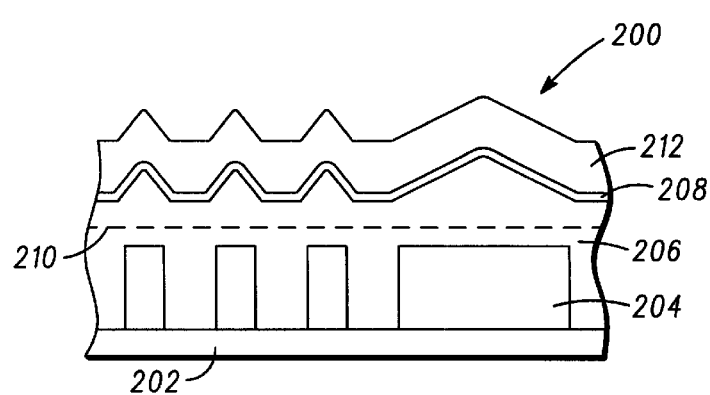
FIG. 3 is a partial schematic cross-sectional view of a further wafer according to the present invention.

FIG. 3 is a partial schematic cross-sectional view of a further wafer 200 according to the invention. The lower layers of the wafer 200 according to FIG. 3 are similar to the lower layers of the wafer 100 according to FIG. 2. Thus, a substrate 202, a device feature 204 and an oxide layer 206 with a non-planar surface are provided. On the oxide layer 206 a relatively thin second layer 208 is provided. On the layer 208 a further layer 212 comprising of another material is deposited. The desired thickness of the oxide layer 206 is, similarly to FIG. 2, indicated by a dashed line 210.

Again starting from the situation that the oxide layer 206 has been deposited over the substrate 202 and on the metal layer 204, the method for polishing down to the desired thickness 210 will be explained. Firstly, a layer 208 with particular physical properties is deposited on the oxide layer 206, for example silicon nitride. On such silicon nitride layer 208 a further layer 212 is deposited as a top layer. This top layer can for example be a polysilicon layer or a further oxide layer. The whole wafer 200 is then processed by chemical-mechanical polishing. The top layer 212 has different physical properties than the layer 208. For example, in the case of a combination of a top layer 212 made from oxide and a layer 208 made from silicon nitride, there are differences related to the frictional properties. Once the top layer 212 is removed as far that the layer 208 is polished, a variation of the physical properties is detected. Now, depending on the distance between the layer 208 and the desired thickness 210, the polishing process can be stopped just after a variation was detected (i.e., substantially simultaneously) or after a certain (i.e., predetermined) time interval. Advantageously, such time interval is determined during the polishing of the upper layers. As a result, the top layer 212 and the layer 208 are completely removed, and a wafer with the desired thickness 210 comprising of the layers 202, 204, and 206 is provided.

Thus, a method and a semiconductor wafer are provided that allow a production of a very accurate device with regard to the surface quality and the thickness of the layers. The manufacturing process is reliable and cost efficient, in particular since all of the layers can be deposited in situ so that the deposition of the "sacrificial" layer can be accomplished in the conventional manufacturing set up.

While the invention has been described in terms of particular structures, devices and methods, those of skill in the art will understand based on the description herein that it is not limited merely to such examples and that the full scope of the invention is properly determined by the claims that follow.

What is claimed is:

1. A method for determining an endpoint during chemical-mechanical polishing of a semiconductor wafer, comprising the steps of:
   providing the semiconductor wafer;
   depositing a first layer over the semiconductor wafer, wherein the first layer has a first portion on a second portion;
   depositing, on the first layer, a sacrificial layer, wherein the physical properties of the sacrificial layer are different from the physical properties of the first layer;
   polishing the semiconductor wafer to remove the sacrificial layer and the first portion of the first layer; and
   detecting a variation of the physical properties between the sacrificial layer and the first layer when polishing reaches the first layer;
   determining an endpoint on the basis of the variation;
   depositing a third layer on the sacrificial layer, wherein the physical properties of the sacrificial layer are different from the physical properties of the third layer; and
   removing the third layer during polishing.

2. A method according to claim 1, wherein determining the endpoint occurs substantially simultaneously with detecting the variation.

3. A method according to claim 1, wherein determining the endpoint occurs when a predetermined time interval has expired after the variation was detected.

4. A method to claim 1, wherein determining the endpoint is performed when a predetermined time interval has expired after the variation was detected, wherein a length of the predetermined time interval is determined during polishing.

5. A method according to claim 1 wherein the physical properties are optical properties.

6. A method according to claim 1 wherein the physical properties are frictional properties.

7. A method according to claim 1 wherein the first layer and the second layer have similar polishing rates.

8. A method according to claim 1 wherein the first layer and the second layer have different polishing rates.

9. A method according to claim 1 wherein the first layer comprises an oxide.

10. A method according to claim 1 wherein the sacrificial layer comprises polysilicon.

11. A method according to claim 1 wherein the sacrificial layer comprises silicon nitride.

12. A method according to claim 1, wherein the first layer is a first oxide, the sacrificial layer is silicon nitride and the third layer is a second oxide.

13. A method according to claim 1, wherein: depositing the first layer further comprises depositing the first layer on a fourth layer, wherein the fourth layer is over the semiconductor wafer, is patterned and has a first height; and the second portion of the first layer has a second height and the second height is greater than the first height.

14. A method according to claim 13, wherein the third layer is a metal and the first layer is an oxide.

15. A method according to claim 13, wherein the third layer has an opening and depositing the first layer further comprises depositing the first layer within the opening.

* * * * *

UNITED STATES PATENT AND TRADEMARK OFFICE
CERTIFICATE OF CORRECTION

PATENT NO.      : 6,593,238 B1                                            Page 1 of 1
DATED           : July 15, 2003
INVENTOR(S)     : David Weston Haggart, Jr. and Walter Glashauser It is certified that error appears in the above-identified patent and that said Letters Patent is hereby corrected as shown below:

<u>Title page,</u>
Item [73], Assignees, please change from "Motorola, Inc., Schaumburg, IL (US)
to -- MOTOROLA, INC., Schaumburg, IL (US)
SEMICONDUCTOR 300 GMBH & CO. KG, Dresden, Germany
INFINEON TECHNOLOGIES AG, Munchen, Fed Rep Germany --

Signed and Sealed this

Ninth Day of December, 2003

JAMES E. ROGAN
*Director of the United States Patent and Trademark Office*